(12) United States Patent
Akondy Raja Raghupathi

(10) Patent No.: US 11,870,465 B2
(45) Date of Patent: *Jan. 9, 2024

(54) DIGITAL FILTER FOR A DELTA-SIGMA ANALOG-TO-DIGITAL CONVERTER

(71) Applicant: TEXAS INSTRUMENTS INCORPORATED, Dallas, TX (US)

(72) Inventor: Venkataratna Subrahmanya Bharathi Akondy Raja Raghupathi, Cypress, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 18/152,218

(22) Filed: Jan. 10, 2023

(65) Prior Publication Data

US 2023/0163781 A1  May 25, 2023

Related U.S. Application Data

(63) Continuation of application No. 17/381,460, filed on Jul. 21, 2021, now Pat. No. 11,552,648.

(60) Provisional application No. 63/140,585, filed on Jan. 22, 2021.

(51) Int. Cl.
  *H03M 3/00* (2006.01)
(52) U.S. Cl.
  CPC .......... *H03M 3/438* (2013.01); *H03M 3/458* (2013.01)
(58) Field of Classification Search
  CPC .............................. H03M 3/438; H03M 3/458

USPC ................................... 341/155, 143
See application file for complete search history.

(56) References Cited

U.S. PATENT DOCUMENTS

| | | | |
|---|---|---|---|
| 3,978,348 A * | 8/1976 | Henninger | H04L 25/06 341/157 |
| 5,592,517 A * | 1/1997 | Camp | G06F 17/10 375/350 |
| 5,621,675 A | 4/1997 | Linz et al. | |
| 5,721,547 A | 2/1998 | Ongo | |
| 6,532,441 B1 | 3/2003 | Urso | |
| 6,795,007 B2 | 9/2004 | Mayes | |

(Continued)

OTHER PUBLICATIONS

International Search Report dated May 5, 2022, PCT Application No. PCT/US2022/013447, 2 pages.

(Continued)

*Primary Examiner* — Jean B Jeanglaude
(74) *Attorney, Agent, or Firm* — Brian D. Graham; Frank D. Cimino

(57) ABSTRACT

An analog-to-digital converter (ADC) includes a modulator, an integrator circuit, and first and second differentiator circuits. The modulator has a modulator input and a modulator output. The modulator input is configured to receive an analog signal, and the modulator is configured to generate digital data on the modulator output. The integrator circuit has an integrator circuit input and an integrator output. The integrator input is coupled to the modulator output. The first differentiator circuit is coupled to the integrator output, and the first differentiator circuit is configured to be clocked with a first clock. The second differentiator circuit is coupled to the integrator output, and the second differentiator circuit configured to be clocked with a second clock. The second clock is out of phase with respect to the first clock.

20 Claims, 4 Drawing Sheets

(56) References Cited

U.S. PATENT DOCUMENTS

| | | | |
|---|---|---|---|
| 7,129,876 B2* | 10/2006 | Koyanagi | H03M 1/668 341/143 |
| 7,227,482 B2 | 6/2007 | San et al. | |
| 8,564,346 B2* | 10/2013 | Quan | H03K 5/1565 327/158 |
| 9,184,765 B1 | 11/2015 | Wang et al. | |
| 2008/0062026 A1 | 3/2008 | Melanson | |
| 2008/0258952 A1 | 10/2008 | Maezawa et al. | |
| 2014/0015700 A1 | 1/2014 | Oishi | |
| 2016/0048154 A1* | 2/2016 | Menkhoff | G06F 1/04 713/501 |
| 2019/0280709 A1 | 9/2019 | Bashir et al. | |

OTHER PUBLICATIONS

Written Opinion dated May 5, 2022, PCT Application No. PCT/US2022/013447, 4 pages.

* cited by examiner

DIGITAL FILTER FOR A DELTA-SIGMA ANALOG-TO-DIGITAL CONVERTER

CROSS-REFERENCE TO RELATED APPLICATIONS

This application is a continuation of U.S. patent application Ser. No. 17/381,460, filed on Jul. 21, 2021, which claims priority to U.S. Provisional Application No. 63/140,585, filed Jan. 22, 2021, which is hereby incorporated by reference.

BACKGROUND

Various applications exist for analog-to-digital converters (ADCs). An ADC converts an input analog signal to a digital output value. One type of ADC is a delta-sigma ADC. A delta-sigma ADC includes a delta-sigma modulator coupled to a filter. The delta-sigma modulator receives the input analog signal and generates output modulator data that includes a set of logic 0's and 1's. The number of logic 0's relative to the number of logic in a given time period is a function of the magnitude of the input analog signal. The filter receives the output modulator data from the delta-sigma modulator. The filter attenuates high-frequency noise and decimates the filtered modulator data to produce a lower data rate output value (lower than the sampling rate of the delta-sigma modulator).

SUMMARY

In one example, an analog-to-digital converter (ADC) includes a modulator, an integrator circuit, and first and second differentiator circuits. The modulator has a modulator input and a modulator output. The modulator input is configured to receive an analog signal, and the modulator is configured to generate digital data on the modulator output. The integrator circuit has an integrator circuit input and an integrator output. The integrator input is coupled to the modulator output. The first differentiator circuit is coupled to the integrator output, and the first differentiator circuit is configured to be clocked with a first clock. The second differentiator circuit is coupled to the integrator output, and the second differentiator circuit configured to be clocked with a second clock. The second clock is out of phase with respect to the first clock.

BRIEF DESCRIPTION OF THE DRAWINGS

For a detailed description of various examples, reference will now be made to the accompanying drawings in which.

DETAILED DESCRIPTION

Figure 1:
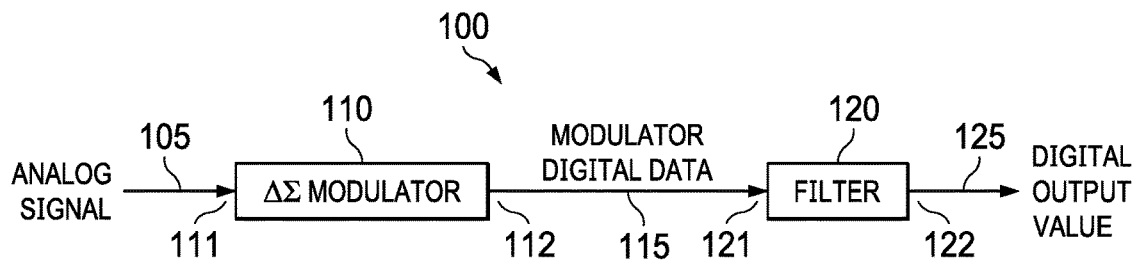
FIG. 1 is a block diagram of a delta-sigma analog-to-digital converter having a filter in accordance with an example implementation.

FIG. 1 shows an example implementation of an ADC 100 that converters an input analog signal 105 to a digital output value 125. In this example, the ADC 100 is a delta-sigma ADC 100. Delta-sigma ADC 100 includes a delta-sigma modulator 110 and a filter 120. The delta-sigma modulator 110 includes a modulator input 111 and a modulator output 112. The filter 120 includes a filter input 121 and a filter output 122. The modulator input 111 receives the input analog signal 105 and produces modulator digital data 115 on its modulator output 112. The modulator digital data 115 may be digital data (logic highs and lows) having a variable duty cycle that is proportional to the magnitude of the input analog signal 105.

The modulator output 112 is coupled to the filter input 121. The filter 120 filters (e.g., low-pass filters) the modulator digital data 115 and produces the digital output values 125 on the filter output 122. Various types of filters exist for implementation in a delta-sigma ADC. In the examples described herein, the filter 120 is a "sinc" filter. In general, a sinc filter implementation for the delta-sigma ADC 100 is a low-pass filter. The delta-sigma modulator 110 samples the input analog signal 105 at a particular (application-specific) sampling rate. The filter 120 filters the modulator digital data 115 at the same sampling rate. The sampling rate may be significantly faster than any downstream consumer (e.g., a processor) could process. Accordingly, the filter 120 decimates the fast, filtered data to produce a stream of digital output values 125 a lower output rate than the sampling rate. The ratio of the sampling rate to the output data rate is referred to as the "oversampling ratio" (OSR). The oversampling ratio also may be referred to as the decimation ratio. In one example, the OSR is 100, which means the filter outputs one digital output value 125 for every 100 cycles of modulator digital data 115.

A larger OSR means that filter 120 outputs fewer digital output values for a given number of modulator digital data (a lower output data rate), but a larger OSR also results in a decrease in noise for the digital output values 125. Conversely, a smaller OSR is characterized by a higher output data rate, but with an increase in noise. Thus, a tradeoff exists between OSR and noise. To achieve lower noise digital output values 125, a higher OSR should be implemented in the filter 120, but that will result in a lower output data rate. If a higher output data rate is desired, a lower OSR should be implemented, but the resulting digital output values 125 will experience an increase in noise.

Figure 2:
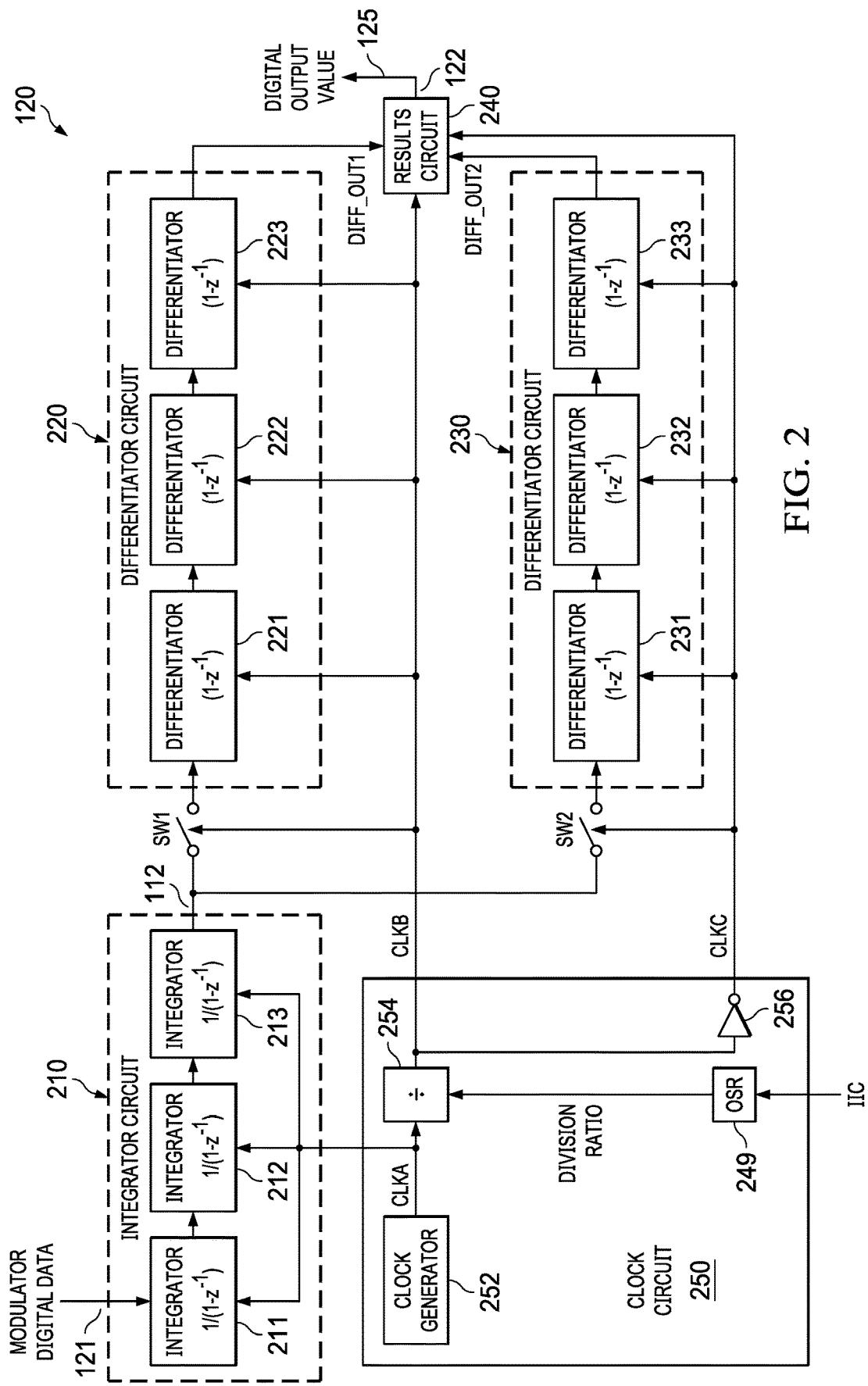
FIG. 2 is a block diagram of the filter having two differentiator circuits in accordance with an example.

FIG. 2 shows an example implementation of filter 120 that provides for an increased data rate for a given OSR value compared to conventional sinc filters. The filter 120 of FIG. 2 includes an integrator circuit 210, differentiator circuits 220 and 230, a results circuit 240, a clock circuit 250, and switches SW1 and SW2. Switch SW1 is coupled between the integrator circuit 210 and differentiator circuit 220. Switch SW2 is coupled between the integrator circuit 210 and differentiator circuit 230. In this example, integrator circuit 210 is a three-stage integrator including integrators 211, 212, and 213. Differentiator circuits 220 and 230 are three-stage differentiators. Differentiator circuit 220 includes differentiators 221, 222, and 223, and differentiator circuit 230 includes differentiators 231, 232, and 233.

When switch SW1 is closed, the output of integrator 213 is provided to the input of differentiator 221 within the differentiator circuit 220. Similarly, when switch SW2 is closed, the output of integrator 213 is provided to the input of differentiator 231 within the differentiator circuit 230. The outputs of differentiator circuits 220 and 230 (the outputs of the last differentiator 223 and 233, respectively in each differentiator circuit) are provided to the results circuit 240. The output signal from differentiator 223 is DIFF_OUT1. The output signal from differentiator 233 is DIFF_OUT2. Output signals DIFF_OUT1 and DIFF_OUT2 are provided as input signals to the results circuit 240. In one example (and further described below regarding FIG. 6), the results circuit 240 is a multiplexer which outputs one or the other of the differentiator circuit outputs as the digital output value 225. The results circuit 240 outputs DIFF_OUT1 or DIFF_OUT2 as the digital output value 225 responsive to, for example, respective rising edges of CLKB and CLKC.

The clock circuit 250 is coupled to integrators 211-213 of integrator circuit 210, differentiators 221-223 of differentiator circuit 220, and differentiators 231-233 of differentiator circuit 230. The clock circuit 250 generates clock signals (also called "clocks") CLKA, CLKB, and CLKC. Clock CLKA is provided to switch SW1 and to integrators 211, 212, and 213 of integrator circuit 210. Clock CLKB is provided to switch SW2 and to differentiators 231, 232, and 233 of differentiator circuit 230. The clock circuit 250 includes a clock generator 252 which generates clock CLKA. Clock CLKA is at a frequency that is equal to the sampling rate of the delta-sigma modulator 110. In one example, the frequency of clock CLKA is 20 MHz. The clock generator 252 is coupled to a frequency divider 254, and the output of the frequency divider is coupled to an input of an inverter 256. The frequency divider 254 divides down the frequency of clock CLKA to produce clock CLKB.

Figure 3:
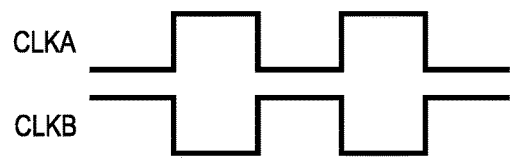
FIG. 3 is a timing diagram of clocks used to clock the differentiator circuits in accordance with an example.

In one example, the division ratio implemented within the frequency divider 254 is equal to the value of OSR. For example, for a target value of OSR equal to 100, the frequency divider 254 produces a clock frequency for clock CLKB that is one one-hundredth (1/100) of the frequency of clock CLKA. In one example, a register 249 is programmable (e.g., via a serial interface such as the Inter-Integrated Circuit (IIC) interface. The value programmed into register 249 is used as the division ratio for the frequency divider and thus the OSR value. The inverter 256 produces clock CLKC that has the same frequency as clock CLKB but the clock CLKC is out-of-phase with respect to clock CLKB. In the specific example of FIG. 2, clock CLKC is 180 degrees output-of-phase with respect to clock CLKB (clock CLKC is a logical inverse of clock CLKB). FIG. 3 shows example waveforms for clocks CLKA and CLKB.

Figure 4:
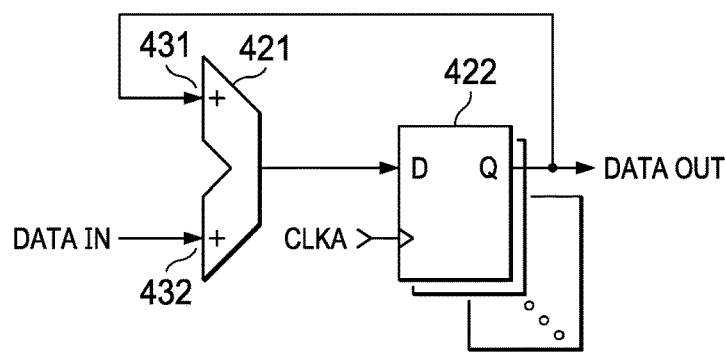
FIG. 4 is a logic circuit implementation of an integrator within the filter.

FIG. 4 is a circuit 410 that is example implementation of each integrator 211-213. Circuit 410 includes an adder 421 coupled to multiple data (D) flip-flops 422. In particular, the output of adder 421 is coupled to the D input of the flip-flops 422, and the Q output of the D flip-flops 422 is coupled an input 431 of adder 421. Input data (Data In) is provided to input 432 of adder 421. In one example, Data In is a multibit value (e.g., 24 bits). In one example, the number of D flip-flops 422 equals the number of bits of Data In. If Data In has 24 bits, then there are 24 D flip-flops 422. The Q outputs of the D flip-flops are coupled to the multi-bit input 431 of the adder 421. The adder 421 adds together the data on its inputs 431 and 432 and provides each bit of the resulting summed value to a respective D input of D flip-flops 422. The D flip-flops are clocked by clock CLKA. The circuit 410 is an accumulator in that the output bits (Data Out) are fed back and added into the next Data In value. The multi-bit Data Out of integrator 211 is coupled to the Data In of integrator 212, and the Data Out of integrator 212 is coupled to the Data In of integrator 213. The Data Out of integrator 213 is coupled with switches SW1 and SW2. Integrator 211 accumulates the modulator digital data 115 and provides the accumulated value to the next integrator 212 in the series of integrators. Integrator 212 accumulates the accumulated result from integrator 211. Similarly, integrator 213 accumulates the accumulated result from integrator 212.

Figure 5:
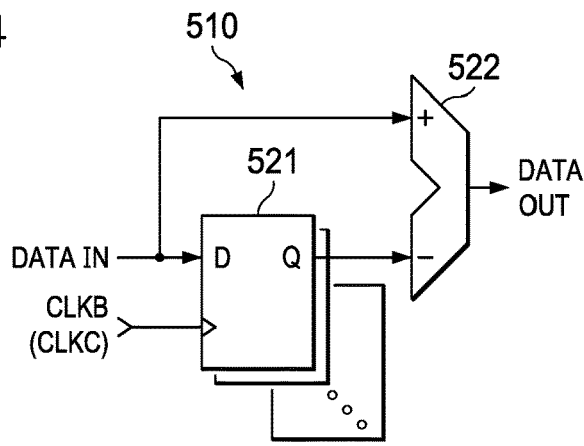
FIG. 5 is a logic circuit implementation of a differentiator within the filter.

FIG. 5 is a circuit 510 that is example implementation of each differentiator 221-223 and 231-233. Circuit 510 includes D flip-flops 521 whose Q outputs are coupled to a multi-bit inverting input of an adder 522. Each input data bit (Data In) to the differentiator circuit 510 is coupled to the D input of a respective D flip-flop 521 and to the respective non-inverting input of adder 522. The adder 522 subtracts the data on the Q outputs of D flip-flops 521 from the current input data (Data In). The adder 522 also may be referred to as a subtractor. The output of adder 522 is Data Out from the differentiator. The D flip-flop 521 is clocked by the respective clock—clock CLKB for differentiators 221-223 and clock CLKC for differentiators 231-233. With each pulse (e.g., rising edge) of the input clock (CLKB or CLKC), the previously latched data from D flip-flops 521 is subtracted from the current input Data In data value. With respect to the differentiator circuit 220 of FIG. 2, the Data Out of differentiator 221 is coupled to the Data In of differentiator 222, and the Data Out of differentiator 222 is coupled to the Data In of differentiator 223. The Data Out of differentiator 223 is DIFF_OUT1 which is provided to the results circuit 240. Similarly, the Data Out of differentiator 231 is coupled to the Data In of differentiator 232, the Data Out of differentiator 232 is coupled to the Data In of differentiator 233, and the Data Out of differentiator 233 is DIFF_OUT2 which is provided to the results circuit 240.

Figure 6:
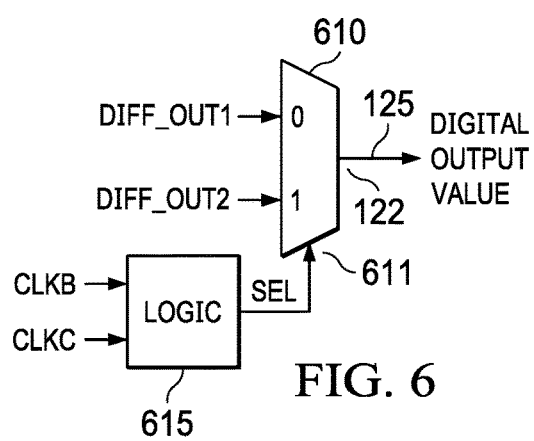
FIG. 6 is a circuit implementation of a results circuit within the filter.

FIG. 6 shows an example implementation of results circuit 240. In the example of FIG. 6, the results circuit 240 includes a multiplexer 610. The multiplexer 610 has a 0-input, a 1-input, a selection input 611, and an output 122. The output signal DIFF_OUT1 from differentiator circuit 220 is provided to the 0-input of multiplexer 610, and the output signal DIFF_OUT2 from differentiator circuit 230 is provided to the 1-input of multiplexer 610. A selection signal (SEL) is generated by a logic circuit 615 based on CLKB and CLKC. In one example, the logic circuit 615 is a digital circuit that asserts SEL to a first logic state to select the 0-input of the multiplexer 610 responsive to CLKB being asserted high, and asserts SEL to a second logic state to select the 1-input of the multiplexer 610 responsive to CLKC being asserted high. The selection signal SEL is twice the frequency of CLKB or CLKC and thus the results circuit 240 outputs data at twice the rate of either of the differentiator circuits 220 or 230. The output 122 of multiplexer 610 provides the digital output value 125 from the filter 120. In another example, the results circuit 240 is a register that latches the result available from differentiator 223 or differentiator 233.

Figure 7:
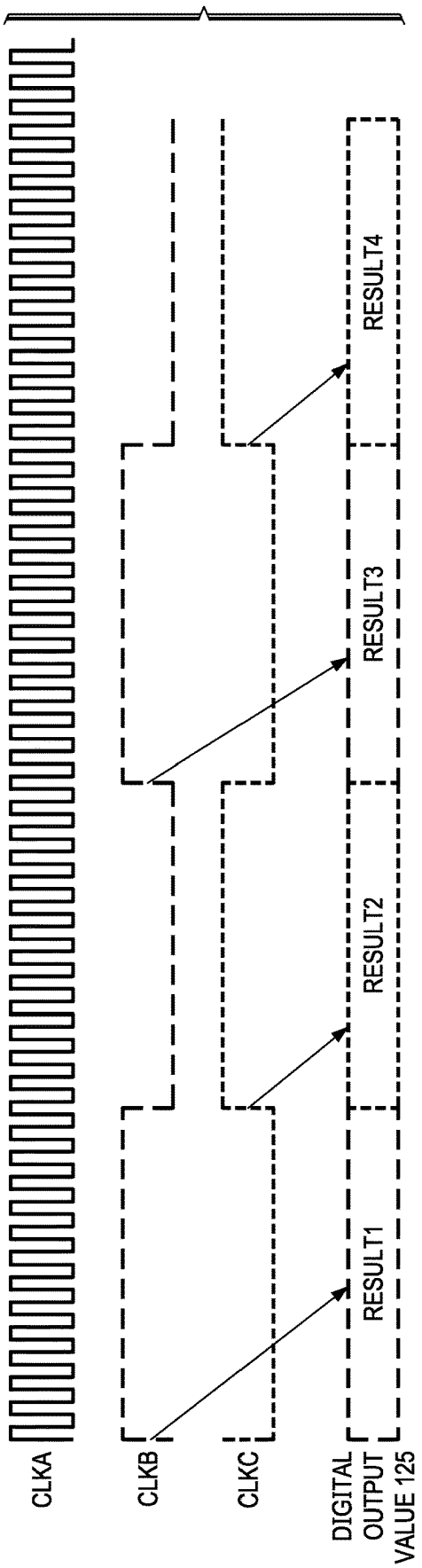
FIG. 7 is a timing diagram showing the relationship of the clock used to clock the integrators within the filter as well as the clocks used to clock the differentiator circuits.

FIG. 7 is a timing diagram with examples of clocks CLKA, CLKB, and CLKC and the digital output values 125. As can be seen, the frequency of clock CLKA is greater than the frequencies of clocks CLKB and CLKC. In this example, each rising edge of clock CLKB causes the differentiator circuit 220 to provide its output data (DIFF_OUT1) through the results circuit 240 as digital output value 125, which is shown in FIG. 7 as Result1 and Result3. Each rising edge of clock CLKC causes the differentiator circuit 230 to provide its output data (DIFF_OUT2) through the results circuit 240 as digital output values 125 (Result2 and Result4).

FIG. 7 illustrates that the digital output value 125 is output by the results circuit 240 for each period of clock CLKB (CLKC). Accordingly, for a given OSR level, the filter 120 outputs digital output values 125 at twice the data rate compared to a sinc filter that only has a single differentiator stage. The filter 120 described herein achieves higher output data rates without also suffering an increase in noise.

FIG. 2 includes an integrator circuit with three integrators 211-213 and differentiator circuits 220 and 230, each with three differentiators, thereby implementing a third order sinc filter. The order of the sinc filter should be at least 1 plus the order of the delta sigma modulator 110. The order of the sinc filter 120 can be more than 1 greater than the order of the modulator. For example, if the delta-sigma modulator 110 is a second-order modulator, the filter 120 could be a third order, fourth order, fifth order, etc. sinc filter.

Figure 8:
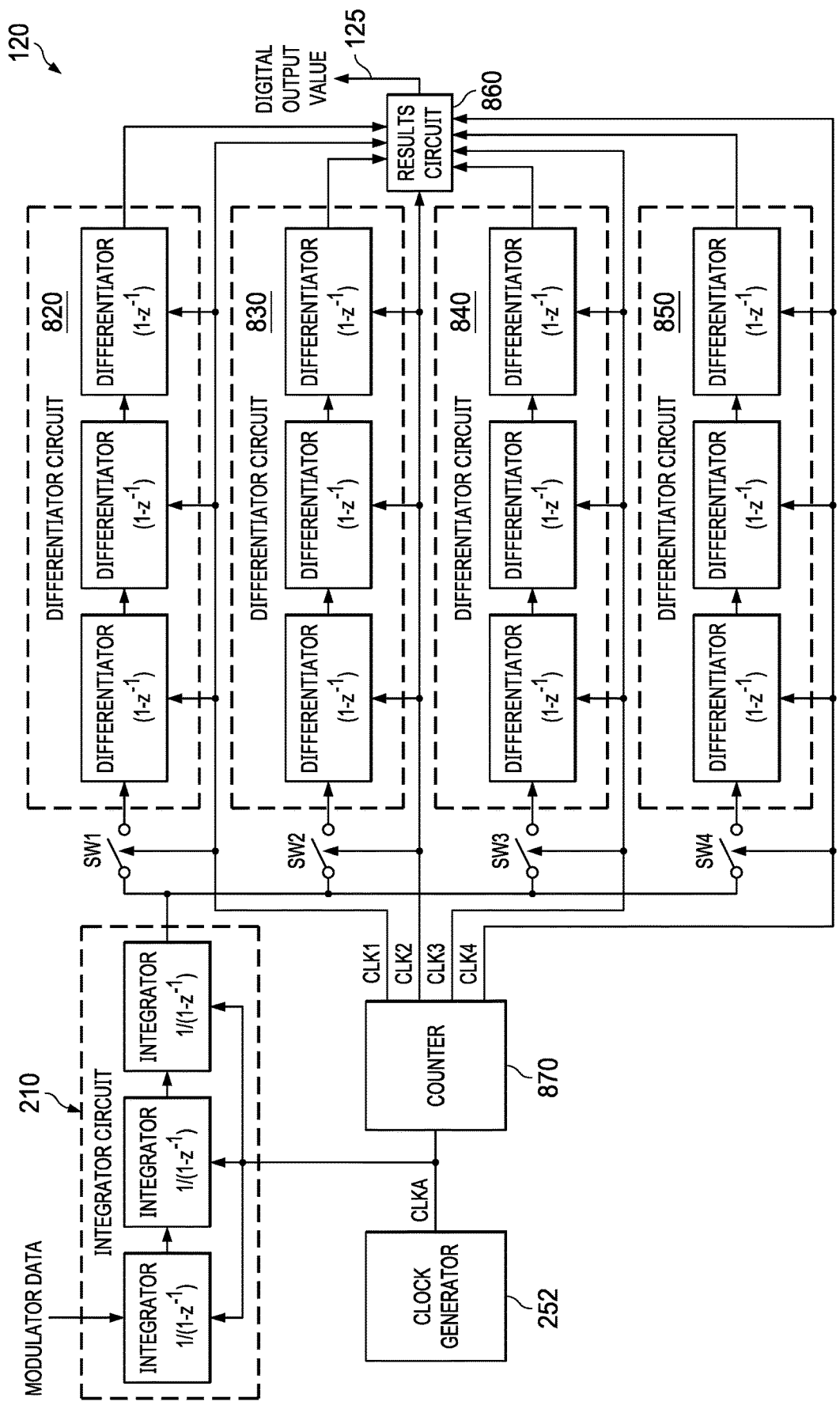
FIG. 8 is a block diagram of the filter having four differentiator circuits in accordance with an example.

FIG. 2 shows an example of a filter 120 having two differentiator circuits 220 and 230 operable in parallel as explained above. The number of differentiator circuits can be scaled up to more than two differentiator circuits (three, four, etc. differentiator circuits). FIG. 8 shows an example of a filter 120 having four differentiator circuits 820, 830, 840, and 850. Each differentiator circuit in this example includes three differentiators, each implemented, for example, as described above and shown in FIG. 5. Each differentiator circuit 820, 830, 840, and 850 is coupled to integrator circuit 210 by a separate switch. Switch SW81 is coupled between the integrator circuit 210 and differentiator circuit 820. Switch SW82 is coupled between the integrator circuit 210 and differentiator circuit 830. Switch SW83 is coupled between the integrator circuit 210 and differentiator circuit 840. Switch SW84 is coupled between the integrator circuit 210 and differentiator circuit 850.

A counter 870 generates four clocks CLK1, CLK2, CLK3, and CLK4 using CLKA from the clock generator 252. The four clocks CLK1-CLK4 are quadrature clocks with all four clocks having the same frequency and phase-shifted by 90 degrees one clock from the other. The counter 870 may be an up-counter counting from 0 up to the OSR value. Each rising (or falling) edge of CLKA causes the counter 870 to increment its output count value by one. Clocks CLK1-CLK4 are taken from tap points of the counter 870. For example, for an OSR value of 100, CLK1 is forced high at tap point 1 and low at tap point 50. CLK2 (90 degrees phase shifted from CLK1) is taking at tap points 25 and 75 (forced high upon tap point 25 being logic high and forced low upon tap point 50 being logic high). Similarly, CLK3 (180 degrees phase shifted from CLK1) is generated based on tap points 50 and 100 (forced high when tap point 50 is high and forced low when tap point 100 is high), and CLK4 (270 degrees phase shifted from CLK1) is generated based on tap points 75 and 25 (forced high when tap point 75 is high and forced low when tap point 25 is high).

Figure 9:
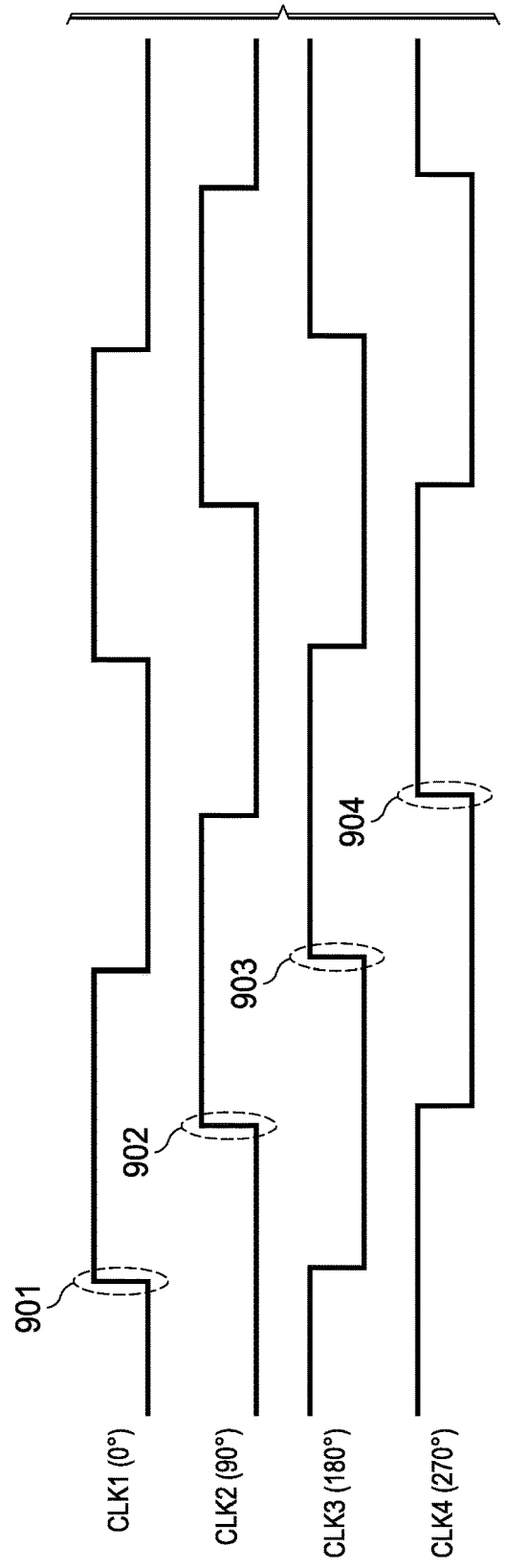
FIG. 9 is a timing diagram of the clocks used to clock the four differentiator circuits in accordance with an example.

FIG. 9 is a timing diagram of the clocks CLK1-CLK4. The clocks CLK1-CLK4 have the same frequency but are phase-shifted with respect to each other by 90 degrees (0 degrees, 90 degrees, 180 degrees, and 270 degrees). Each rising edge (or falling edge) of a clock causes its respective switch to close and its respective differentiators to be clocked thereby outputting a bit to the results circuit 860. For example, rising edge 901 causes switch SW81 to be closed and differentiator circuit 820 to output a bit to the results circuit 860. Rising edge 902 causes switch SW82 to be closed and differentiator circuit 830 to output a bit to the results circuit 860. Similarly, rising edges 903 and 904 cause their respective switches SW83 and SW84 to close and their respective differentiator circuits 840 and 850 to output sequential bits to the results circuit 860. The results circuit 860 may be implemented as a four-input multiplexer having a selection signal generated based on CLK1-4. Whichever of the four clocks is asserted (e.g., rising edge) causes the results circuit to output the respective differentiator's circuit output value as the digital output value 125 from the filter.

With four clocks CLK1-CLK4 used to clock the differentiator circuits 820, 830, 840, and 850, the results circuit 860 collectively receives data from the differentiator circuits at a rate that is four-times the data rate of a sinc filter having a single differentiator circuit. In general, the data rate output by the filter 120 is a function of the number of differentiator circuits implemented within the filter. The data rate output by the filter is:

$$\text{data rate} = N \times (F\_CLKA)/OSR$$

where N is the number of differentiator circuits and F_CLKA is the frequency of CLKA (the clock used to clock the integrators within the integrator circuit 210).

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Modifications are possible in the described embodiments, and other embodiments are possible, within the scope of the claims.

What is claimed is:

1. A filter for an analog-to-digital converter, the filter comprising:
    a first integrator having a first integrator clock input, a data input, and a data output;
    a first differentiator having a first differentiator clock input, a data input, and a data output;
    a first switch coupled between a data output of the first integrator and a data input of the first differentiator, the first switch having a first switch input;
    a second differentiator having a second differentiator clock input;
    a second switch coupled between the data output of the first integrator and a data input of the second differentiator, the second switch having a second switch input; and
    a clock circuit coupled to the first integrator clock input, the first and second differentiator clock inputs, and to the first and second switch inputs, the clock circuit comprising:
        a first clock generator coupled to the first integrator;
        a second clock generator coupled to the first switch and to the first differentiator; and
        a third clock generator coupled to the second switch and to the second differentiator.

2. The filter of claim 1, in which the filter further comprises a results circuit coupled to the data output of the first differentiator and the data output of the second differentiator.

3. The filter of claim 2, in which the results circuit includes a multiplexer.

4. The filter of claim 1, further comprising:
a second integrator having a data output coupled to the data input of the first integrator, the second integrator having a second integrator clock input;
a third differentiator having a data input coupled to the data output of the first differentiator, the third differentiator having a third differentiator clock input; and
a fourth differentiator having a data input coupled to the data output of the second differentiator, the fourth differentiator having a fourth differentiator clock input.

5. The filter of claim 1, wherein the third clock generator comprises an inverter coupled to the second clock generator.

6. The filter of claim 1, further comprising:
a third differentiator having a third differentiator clock input; and
a third switch coupled between the first integrator and the third differentiator.

7. The filter of claim 1, wherein the second clock generator comprises a clock divider coupled to a register.

8. An analog-to-digital converter (ADC), comprising:
a modulator having a modulator input and a modulator output;
an integrator circuit having an integrator circuit input and an integrator output, the integrator circuit input coupled to the modulator output;
a first differentiator circuit coupled to the integrator output, the first differentiator circuit coupled to a first clock generator; and
a second differentiator circuit coupled to the integrator output, the second differentiator circuit coupled to a second clock generator.

9. The ADC of claim 8, in which the modulator is a delta-sigma modulator.

10. The ADC of claim 8, in which the first differentiator circuit includes at least two first differentiator circuit differentiators, and the second differentiator circuit includes at least two second differentiator circuit differentiators.

11. The ADC of claim 8, in which:
the integrator circuit includes at least three integrators;
the first differentiator circuit includes at least three first differentiator circuit differentiators; and
the second differentiator circuit includes at least three second differentiator circuit differentiators.

12. The ADC of claim 8, in which the first differentiator circuit has a first differentiator circuit output, and the second differentiator circuit has a second differentiator circuit output, and the ADC further comprises a results circuit coupled to the first and second differentiator circuit outputs.

13. The ADC of claim 12, in which:
the results circuit includes a multiplexer having a first multiplexer input, a second multiplexer input, and a selection input;
the first differentiator circuit output is coupled to the first multiplexer input;
the second differentiator circuit output is coupled to the second multiplexer input; and
the first and second clocks have frequencies that are equal to each other.

14. The ADC of claim 8, in which the first and second clocks are 180 degrees out of phase with respect to each other.

15. The ADC of claim 8, further comprising:
a third differentiator circuit coupled to the integrator output.

16. The ADC of claim 15, wherein the first, second, and third clocks have a same frequency.

17. The ADC of claim 8, further including:
a first switch coupled between the integrator output and the first differentiator circuit; and
a second switch coupled between the integrator output and the second differentiator circuit.

18. An analog-to-digital converter (ADC), comprising:
a delta-sigma modulator having a modulator input and a modulator output;
an integrator circuit having an integrator circuit input and an integrator output, the integrator circuit input coupled to the modulator output and to a first clock generator;
a first differentiator circuit coupled to a second clock generator;
a first switch coupled between the integrator output and the first differentiator circuit;
a second differentiator circuit coupled to a third clock generator;
a second switch coupled between the integrator output and the second differentiator circuit; and
a results circuit having first and second results circuit inputs, the first results circuit input is coupled to the first differentiator circuit, and the second results circuit input is coupled to the second differentiator circuit.

19. The ADC of claim 18, wherein the results circuit includes at least one a multiplexer or a register.

20. The ADC of claim 18, in which:
the first switch includes a first switch input; and
the second switch includes a second switch input.

* * * * *